(12) United States Patent
Liu

(10) Patent No.: US 7,361,570 B1
(45) Date of Patent: Apr. 22, 2008

(54) SEMICONDUCTOR DEVICE HAVING AN IMPLANTED PRECIPITATE REGION AND A METHOD OF MANUFACTURE THEREFOR

(75) Inventor: Kaiping Liu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/664,271

(22) Filed: Sep. 17, 2003

(51) Int. Cl.
*H01L 29/72* (2006.01)

(52) U.S. Cl. .............. 438/423; 438/139; 438/149; 438/407; 438/486

(58) Field of Classification Search ............ 438/149, 438/486, 139, 407, 423; 257/408
See application file for complete search history.

(56) References Cited

U.S. PATENT DOCUMENTS 6,395,621 B1 * 5/2002 Mizushima et al. ........ 438/486
6,518,644 B2 2/2003 Fitzgerald
6,555,839 B2 4/2003 Fitzgerald
6,593,173 B1 * 7/2003 Anc et al. .................. 438/149
6,600,170 B1 7/2003 Xiang

* cited by examiner

*Primary Examiner*—Edward Wojciechowicz
(74) *Attorney, Agent, or Firm*—Jacqueline J. Garner; W. James Brady, III; Frederick J. Telecky, Jr.

(57) ABSTRACT

The present invention provides a semiconductor device, a method of manufacture therefor and an integrated circuit including the same. The semiconductor device 100, among other things, may include a substrate 110 having a lattice structure and having an implanted precipitate region 120 located within the lattice structure. Additionally, the semiconductor device 100 may include a dynamic defect 125 located within the lattice structure and proximate the implanted precipitate region 120, such that the implanted precipitate region 120 affects a position of the dynamic defect 125 within the lattice structure. Located over the substrate 110 in the aforementioned semiconductor device 100 is a gate structure 160.

13 Claims, 4 Drawing Sheets

SEMICONDUCTOR DEVICE HAVING AN IMPLANTED PRECIPITATE REGION AND A METHOD OF MANUFACTURE THEREFOR

TECHNICAL FIELD OF THE INVENTION

The present invention is directed, in general, to a semiconductor device and, more specifically, to a semiconductor device having an implanted precipitate region, a method of manufacture therefor, and an integrated circuit including the same.

BACKGROUND OF THE INVENTION

An important aim of ongoing research in the semiconductor industry is increasing semiconductor performance while decreasing the size of semiconductor devices. One known step the industry has taken to attain this increased semiconductor performance is to implement strained silicon technology. Fortunately, strained silicon technology allows for the formation of higher speed devices.

Strained-silicon transistors may be created a number of different ways, including by introducing a dislocation loop, or excess plane of atoms, into a crystalline material. In one instance strained layers are created by forming a layer of silicon germanium (SiGe) over or below a silicon epitaxial layer. The average distance between atoms in the SiGe crystal lattice is greater than the average distance between atoms in an ordinary silicon lattice. Because there is a natural tendency of atoms inside different crystals to align with one another when a second crystal is formed over a first crystal, when silicon is deposited on top of SiGe, or vice-versa, the silicon crystal lattice tends to stretch or "strain" to align the silicon atoms with the atoms in the SiGe layer. In another instance strained layers are created by a layer of dislocation loops. The insertion of an extra plane of atoms (a dislocation loop) in an ordinary silicon lattice creates stress in the surrounding silicon lattice. Fortunately, as the electrons in the strained silicon experience less resistance and flow up to 80% faster than in unstrained silicon, the introduction of the strained silicon layer allows for the formation of higher speed devices.

Problems currently exist, however, with the use of the strained silicon technology. One of the major problems occurs when the many smaller dislocation loops caused when forming the strained silicon tend to agglomerate into fewer but larger dislocation loops. Unfortunately, the larger dislocation loops, as compared to the smaller dislocation loops, have a tendency to penetrate to the surface of the device or cut across the junction, thus causing undesirable leaking through the p-n junction. Another problem exists when threading dislocations in the silicon-germanium layer grow toward the surface of the device rather than remaining where they are supposed to remain, or alternatively growing down. There is currently no feasible technique known for subsiding these aforementioned problems.

Accordingly, what is needed in the art is a semiconductor device and method of manufacture therefore that experiences the benefits of a strained silicon layer without experiencing the aforementioned drawbacks.

SUMMARY OF THE INVENTION

To address the above-discussed deficiencies of the prior art, the present invention provides a semiconductor device, a method of manufacture therefor and an integrated circuit including the same. The semiconductor device, among other things, may include a substrate having a lattice structure and having an implanted precipitate region located within the lattice structure. Additionally, the semiconductor device may include a dynamic defect located within the lattice structure and proximate the implanted precipitate region, such that the implanted precipitate region affects a position of the dynamic defect within the lattice structure. Located over the substrate in the aforementioned semiconductor device is a gate structure.

The present invention further provides a method for manufacturing the aforementioned semiconductor device. The method, in one embodiment, includes implanting a precipitate region within a lattice structure of a substrate, and introducing a dynamic defect within the lattice structure and proximate the implanted precipitate region, such that the implanted precipitate region affects a position of the dynamic defect within the lattice structure. The method further includes forming a gate structure over the substrate.

An integrated circuit is also provided by the present invention. In addition to that included within the semiconductor device above, the integrated circuit further includes transistors located over the substrate and interconnects connecting the transistors to form an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
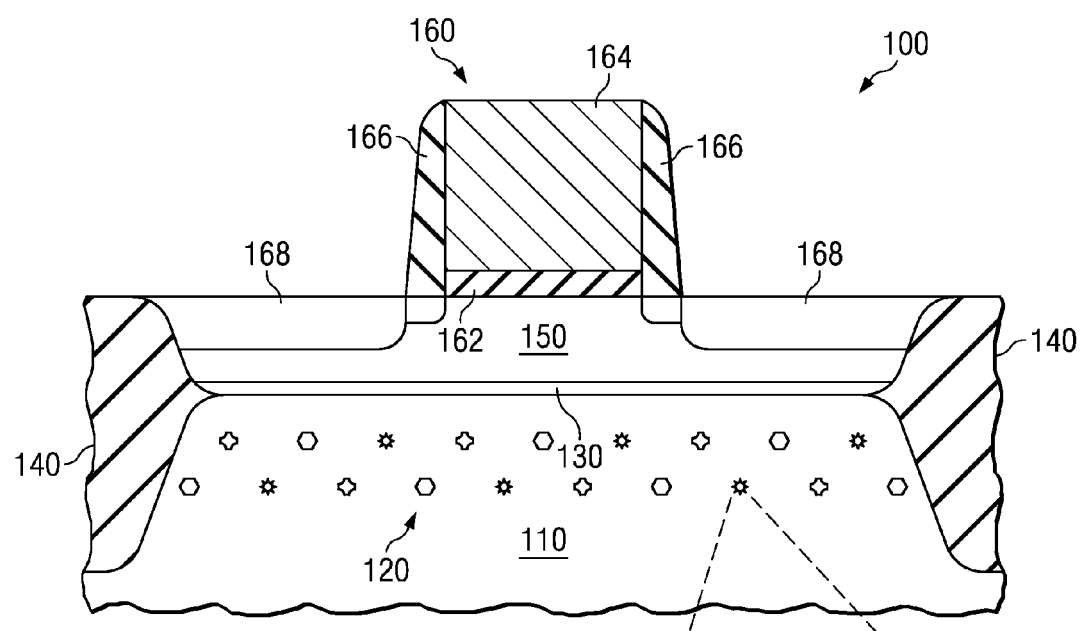
FIG. 1 illustrates a cross-sectional view of a semiconductor device constructed in accordance with the principles of the present invention.
Figure 1:
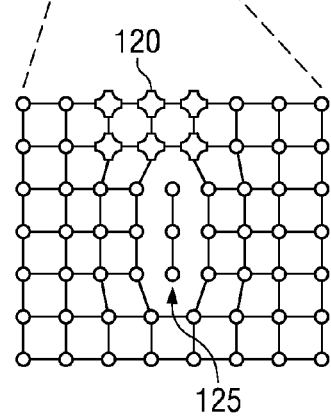

Referring initially to FIG. 1 illustrated is a cross-sectional view of a semiconductor device 100 constructed in accordance with the principles of the present invention. The semiconductor device 100 shown in FIG. 1 includes a first substrate 110. The first substrate 110, as those skilled in the art are aware, includes a lattice structure. Located within the lattice structure of the first substrate 110 is an implanted precipitate region 120.

As is shown in the blown up view of the substrate 110, the lattice structure has a dynamic defect 125 located therein and proximate the implanted precipitate region 120. While the dynamic defect 125 of FIG. 1 is being illustrated as a small dislocation loop formed by the agglomeration of self interstitials, the skilled artisan understands that the dynamic defect 125 may be any one of a number of crystal defects and stay within the scope of the present invention. For example, among others, the dynamic defect could be an edge dislocation, a vacancy, a dislocation loop formed by an agglomeration of vacancies within said lattice, a silicon self-interstitial atom, or a substitutional atom.

Located over the first substrate 110 and between two isolation regions 140 is a silicon-germanium layer 130. The silicon-germanium layer 130, as detailed in the background of the invention section, is often used to create a strained silicon layer to improve the performance of transistors formed therein. In the embodiment of FIG. 1, the silicon-germanium layer 130, in contrast to the strained silicon layer that it helped form, is in a substantially relaxed state.

Accordingly, located over the silicon-germanium layer 130 in the embodiment of FIG. 1 is a second substrate 150. The second substrate 150 optimally comprises a stressed or "strained" silicon substrate. Located over the first substrate 110 in the exemplary embodiment of FIG. 1, and more particularly over the second substrate 150, is a gate structure 160. The gate structure 160 includes a conventional gate oxide 162, a conventional gate electrode 164 and conventional sidewall spacers 166, among other features. As is illustrated, located at least partially under the gate structure 160 are conventional source/drain regions 168.

The implanted precipitate region 120 of the present invention is optimally located from about 60 nm to about 150 nm below a lower surface of the gate structure 160. As is illustrated in FIG. 1, the implanted precipitate region 120, which may optimally comprise silicon dioxide ($SiO_2$) or silicon nitride (SiN), may be a noncontinuous region. The term noncontinuous, as used herein, means that the implanted precipitate region 120 need not be a solid layer, such as might be found with a silicon-on-insulator (SOI) layer.

Unique to the present invention is the ability of the precipitate region 120 to affect a position of the dynamic defect 125. For example, the implanted precipitate region 120 has the ability to tie down at least one, if not a majority of the dynamic defects 125 located within the lattice structure of the first substrate 110. The dynamic defects 125 nucleate in the silicon-germanium layer 130. During stress relaxation, these dynamic defects 125 will grow or tread down toward the precipitate region 120, where they are substantially tied down by the implanted precipitate region 120. As a result, the dynamic defects 125 no longer have the ability to thread toward the surface of the semiconductor device 100. Accordingly, the semiconductor device 100, as compared to conventional semiconductor devices, provides improved surface defect density.

Figure 2:
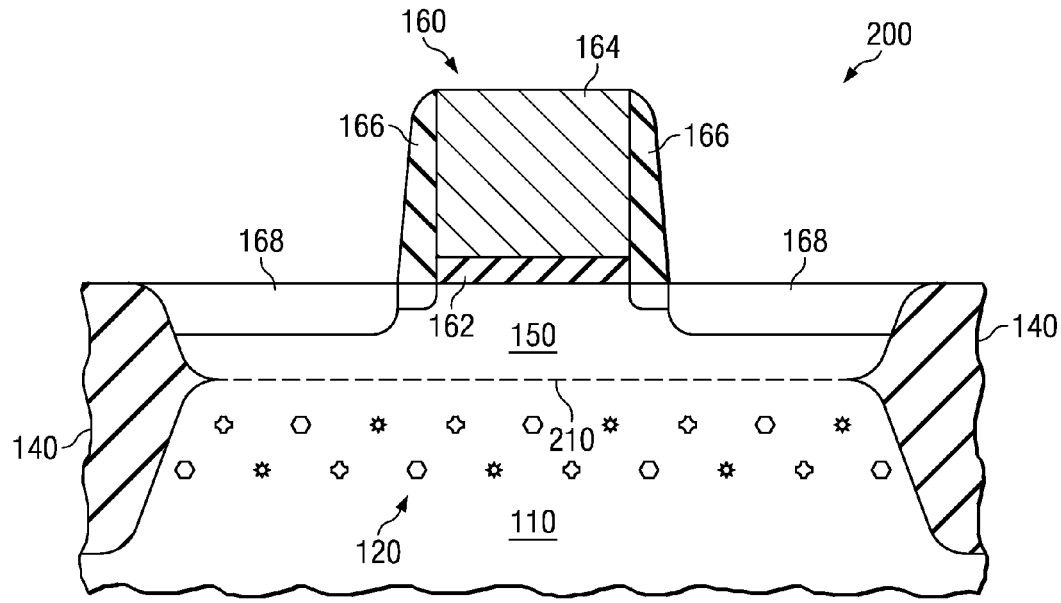
FIG. 2 illustrates a cross-sectional view of an alternative embodiment of a semiconductor device constructed in accordance with the principles of the present invention.

Turning briefly to FIG. 2, illustrated is a cross-sectional view of an alternative embodiment of a semiconductor device 200 constructed in accordance with the principles of the present invention. Except for a few minor differences, the embodiments of FIG. 1 and FIG. 2 are almost identical. Rather than the silicon-germanium layer 130 of FIG. 1, FIG. 2 uses a germanium implanted induced dynamic defect region 210. The germanium implanted induced dynamic defect region 210 (also known as an implant end-of-range defect region) may be formed a number of different ways, however, in one embodiment it is formed with a dose ranging from about 1E15 atoms/cm$^2$ to about 3E15 atoms/cm$^2$ and an energy ranging from about 50 keV to about 80 keV. Other doses, ranges and elements, including substituting silicon for germanium, may also be used.

Similar to above, the implanted precipitate region 120 pins down and stabilizes the dynamic defects 125. Without the implanted precipitate region 120 to pin down or stabilize these dynamic defects 125, the many small dynamic defects 125, such as dislocation loops, will agglomerate into fewer larger dynamic defects 125. These larger dynamic defects 125 have the potential to penetrate to the surface or cut across junction causing leakage through the p-n junction in the final device.

In sum, it is believed that since the implanted precipitate region 120 is very stable and stress levels around it are very high, dynamic defect stability will be enhanced. Additionally, it is believed that the Ostwald ripening effects will be reduced, and that the density of the implanted precipitate region 120 may be used to determine the dynamic defect density level.

Figure 3:
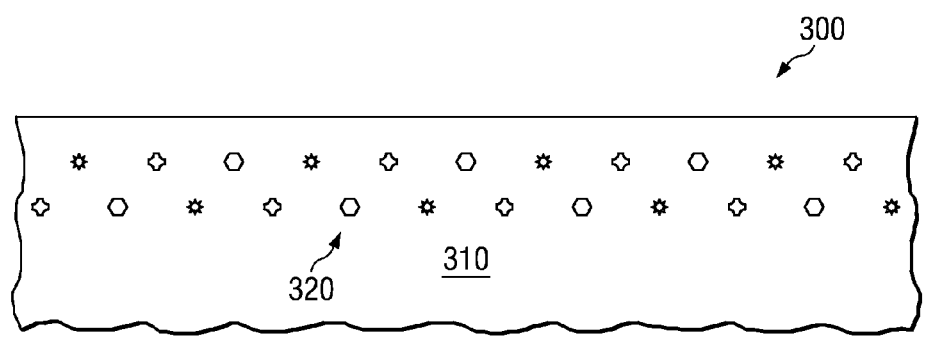
FIG. 3 illustrates a cross-sectional view of a partially completed semiconductor device.

Turning now to FIGS. 3-7, illustrated are cross-sectional views of detailed manufacturing steps instructing how one might, in an advantageous embodiment, manufacture a semiconductor device similar to the semiconductor device 100 depicted in FIG. 1. FIG. 3 illustrates a cross-sectional view of a partially completed semiconductor device 300. The partially completed semiconductor device 300 includes a first substrate 310. The first substrate 310 may, in an exemplary embodiment, be any layer located in the partially completed semiconductor device 300, including a wafer itself or a layer located above the wafer (e.g., epitaxial layer). In the embodiment illustrated in FIG. 3, the first substrate 310 is a silicon substrate.

Implanted within the first substrate 310 in the embodiment of the partially completed semiconductor device 300 illustrated in FIG. 3 is an implanted precipitate region 320. The implanted precipitate region 320, which as described above may comprise small crystal forms of silicon dioxide ($SiO_2$), silicon nitride (SiN) or another similar material, may be formed using a number of different techniques. In one embodiment of the invention, the implanted precipitate region 320 is implanted into the first substrate 310 using an implant energy ranging from about 40 keV to about 70 keV in the presence of a source gas having a dose ranging from about 2E12 atoms/cm$^2$ to about 4E13 atoms/cm$^2$. What often results is the implanted precipitate region 320 having a peak dopant concentration ranging from about 5E17 atoms/cm$^3$ to about 5E18 atoms/cm$^3$.

Figure 6:
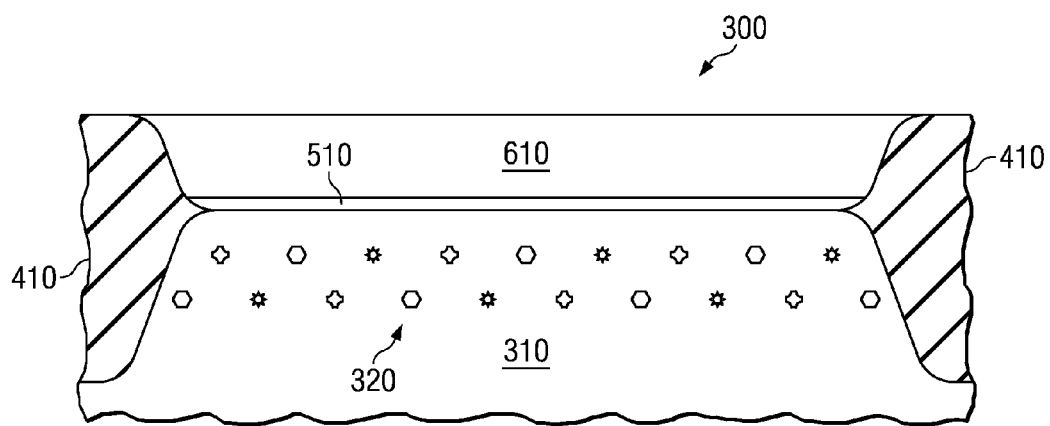
FIG. 6 illustrates a cross-sectional view of the partially completed semiconductor device illustrated in FIG. 5 after formation of a second substrate over the silicon-germanium layer.
Figure 7:
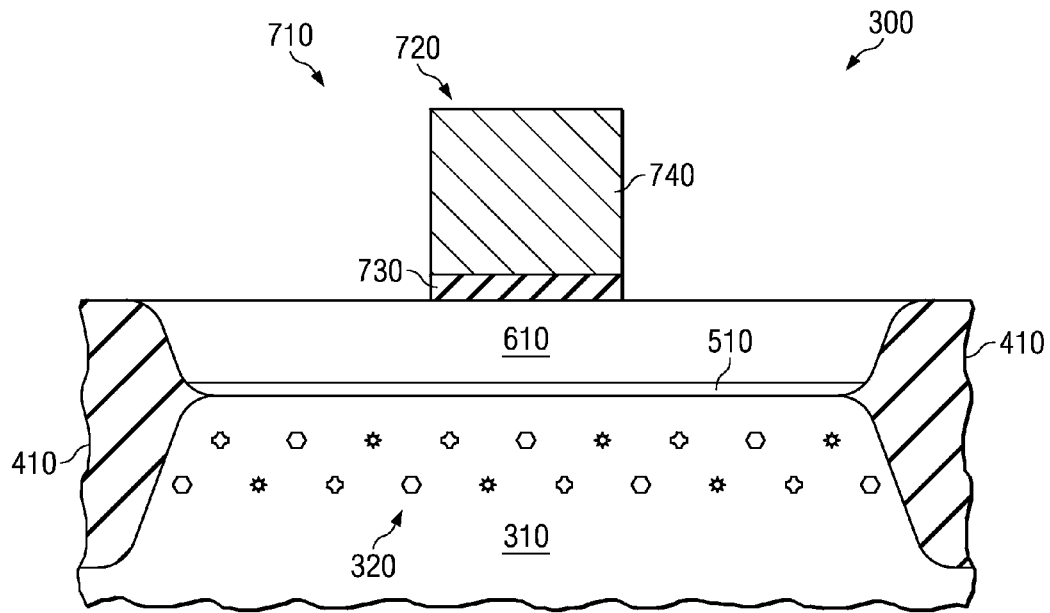
FIG. 7 illustrates a cross-sectional view of the partially completed semiconductor device illustrated in FIG. 6 after formation of a conventional transistor over or within the second substrate.

As indicated above, the depth at which the implanted precipitate region 320 may be placed is dependent on the location where the dynamic defects are desired. For example, it is generally desired that the implanted precipitate region 320 be located between about 60 nm and about 150 nm below the gate structure (FIG. 7). As the gate structure is not yet formed at this point in the manufacturing process, the actual distance the implanted precipitate region is implanted into the first substrate 310 need be calculated. Those skilled in the art are familiar with this calculation, which would most likely take into account the thickness of the silicon-germanium layer (FIG. 5) and the second substrate (FIG. 6).

After implanting the implanted precipitate region 320 into the first substrate 310, the partially completed semiconductor device 300 may be subjected to an anneal, or in this embodiment a series of anneals with temperatures ranging from about 500° C. to about 1200° C. In the embodiment shown and discussed with respect to FIG. 3, the implanted precipitate region 320 is subjected to a first anneal at a temperature ranging from about 600° C. to about 800° C. for a time period ranging from about 60 minutes to about 240 minutes. This first anneal is generally performed to allow the added oxygen or nitrogen to nucleate.

After the first lower temperature anneal, the implanted precipitate region may be subjected to a second anneal. This second anneal is generally performed at a temperature ranging from about 1000° C. to about 1100° C. for a time period ranging from about 60 minutes to about 120 minutes. This second anneal is generally performed to allow the added oxygen or nitrogen to precipitate or grow. For example, where the added element is oxygen, the second anneal allows the oxygen to precipitate around $SiO_x$ nuclei, until substantially all of the oxygen is gone.

Figure 4:
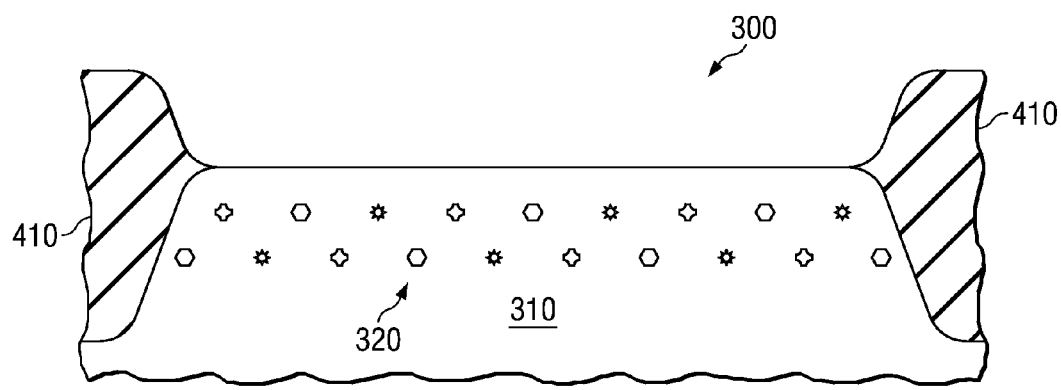
FIG. 4 illustrates a cross-sectional view of the partially completed semiconductor device illustrated in FIG. 3 after conventional formation of isolation regions.

Turning briefly to FIG. 4, illustrated is a cross-sectional view of the partially completed semiconductor device 300 illustrated in FIG. 3 after conventional formation of isolation regions 410. In the particular embodiment shown, the isolation regions 410 are STI structures. Other isolation regions 410 could, however, be used rather than the STI structures. Those skilled in the art understand the many processes that might be used to form the conventional isolation regions 410 illustrated in FIG. 4. Note, however, that the isolation regions 410 may be formed to a depth such that they trim the edges of the implanted precipitate region 320.

Figure 5:
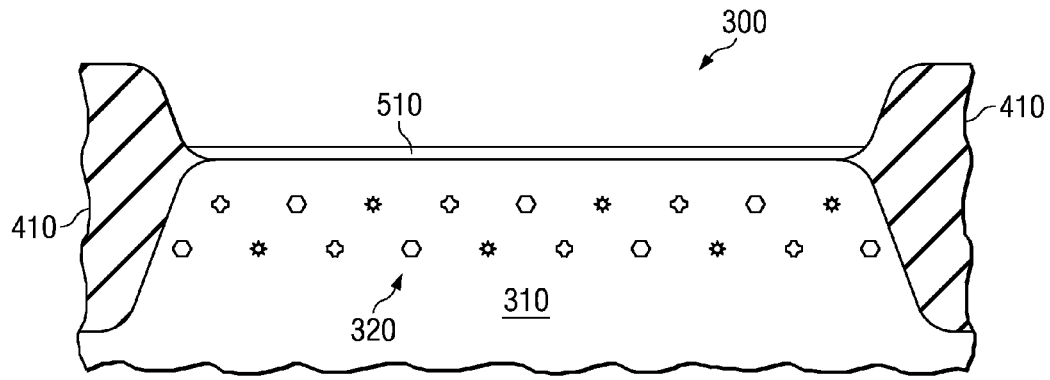
FIG. 5 illustrates the partially completed semiconductor device illustrated in FIG. 4 after formation of a silicon-germanium layer over the surface of the first substrate and between the isolation regions.

Turning to FIG. 5, illustrated is the partially completed semiconductor device 300 illustrated in FIG. 4 after formation of a silicon-germanium layer 510 over the surface of the first substrate 310 and between the isolation regions 410. While silicon-germanium has been chosen for the layer 510 in FIG. 5, any other known or hereafter discovered material having the same purpose as the silicon-germanium, is within the scope of the present invention. Similarly, the silicon-germanium layer 510 may be formed on the first substrate 310 using a number of different techniques, including any well known selective deposition process.

In the embodiment of FIG. 5, the silicon-germanium layer 510 comprises $Si_{1-x}Ge_x$, where x ranges from about 10% to a bout 80%. The silicon-germanium layer 510 may also be formed to a thickness ranging from about 20 nm to about 50 nm while staying within the scope of the present invention. Other silicon-germanium compounds and thicknesses, however, may also be used.

After forming the silicon-germanium layer 510, the partially completed semiconductor device 300 may be subjected to another anneal. This anneal is generally performed using a temperature ranging from about 900° C. to about 1100° C. for a time period ranging from about 0.5 minutes to about 10 minutes. This anneal is typically performed to relax the silicon-germanium layer 510. Upon annealing, the larger crystal size of the silicon-germanium layer 510 compared to the smaller crystal size of the first substrate 310 will cause the dynamic defects to form. In the instant case, the dynamic defects appear in the form of threading dislocations. Other dynamic defects, however, might also form. Fortunately, the similarity in strained polarity between the implanted precipitate region 320 and the silicon-germanium layer 510 will cause this threading to point down toward the implanted precipitate region 320, instead of upwards toward the free surface, as occurs in the prior art devices.

Turning now to FIG. 6, illustrated is a cross-sectional view of the partially completed semiconductor device 300 illustrated in FIG. 5 after formation of a second substrate 610 over the silicon-germanium layer 510. The second substrate, which more than likely will comprise a second silicon substrate, should remain in a stressed state, in accordance with the principles of the present invention. Actually the second substrate 610 should grow on top of the relaxed silicon-germanium layer 510 with minimal threading dislocations on its surface. Accordingly, the second substrate 610 will be strained with minimal defects. As mentioned above, this strained state improves the performance of transistors formed within the second substrate 610.

The second substrate 610 may be formed having a wide range of thicknesses. For example, the second substrate 610 may be formed having a thickness of greater than about 5 nm, and more specifically a thickness ranging from about 10 nm to about 20 nm. This thickness, is quite dependent on the depth of the source/drain regions (FIG. 7) and other transistor implants.

Turning now to FIG. 7, illustrated is a cross-sectional view of the partially completed semiconductor device 300 illustrated in FIG. 6 after formation of a conventional transistor 710 over or within the second substrate 610. The conventional transistor 710 shown in FIG. 7 includes a conventional gate structure 720, which includes a conventional gate oxide 730 and a conventional gate electrode 740. After completion of the gate oxide 730 and gate electrode 740, the manufacturing process continues, resulting in a semiconductor device similar to the semiconductor device 100 shown and discussed with respect to FIG. 1.

Figure 8:
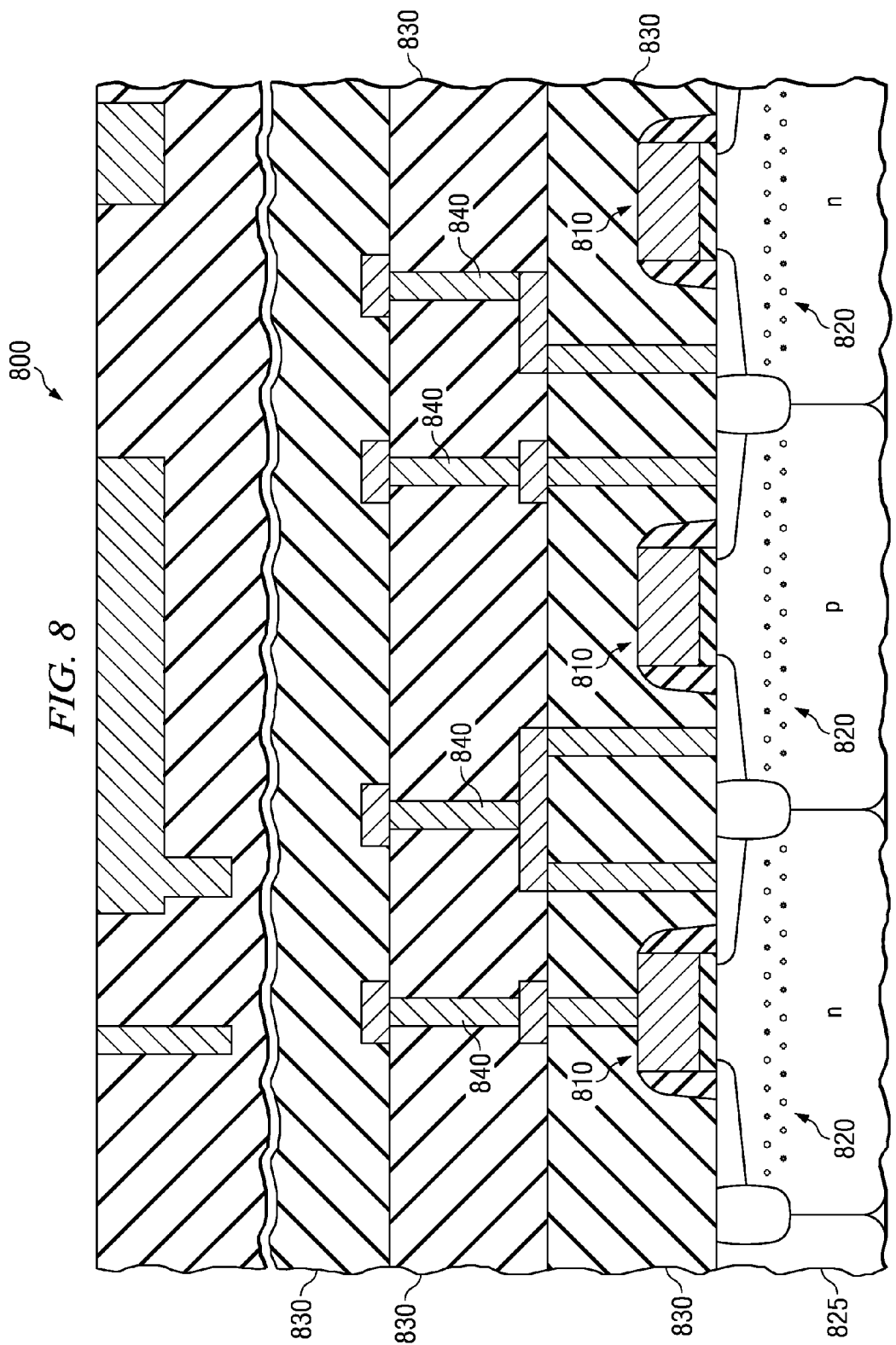
FIG. 8 illustrates a cross-sectional view of a conventional integrated circuit (IC) incorporating semiconductor devices constructed according to the principles of the present invention.

Referring finally to FIG. 8, illustrated is a cross-sectional view of a conventional integrated circuit (IC) 800 incorporating semiconductor devices 810 constructed according to the principles of the present invention. The IC 800 may include devices, such as transistors used to form CMOS devices, BiCMOS devices, Bipolar devices, or other types of devices. The IC 800 may further include passive devices, such as inductors or resistors, or it may also include optical devices or optoelectronic devices. Those skilled in the art are familiar with these various types of devices and their manufacture. In the particular embodiment illustrated in FIG. 8, the IC 800 includes the semiconductor devices 810 having implanted precipitate layers 820 located within the first substrate 825. The IC 800 of FIG. 8 further includes dielectric layers 830 located over the semiconductor devices 810. Additionally, interconnect structures 840 are located within the dielectric layers 830 to interconnect various devices, thus, forming the operational IC 800.

Although the present invention has been described in detail, those skilled in the art should understand that they can make various changes, substitutions and alterations herein without departing from the spirit and scope of the invention in its broadest form.

What is claimed is:

1. A method for forming a semiconductor device, comprising:
   providing a substrate having a lattice structure;
   implanting a precipitate region within said lattice structure;
   introducing a dynamic defect within said lattice structure and proximate said implanted precipitate region, such that said implanted precipitate region affects a position of said dynamic defect within said lattice structure; and
   forming a gate structure over said substrate having said precipitate region therein, wherein a precipitate in said precipitate region is noncontinuous.

2. The method as recited in claim 1 wherein said implanting includes implanting a $SiO_2$ precipitate region.

3. The method as recited in claim 1 wherein said implanting includes implanting a SiN precipitate region.

4. The method as recited in claim 1 wherein said precipitate region is located from about 60 nm to about 150 nm below said gate structure.

5. The method as recited in claim 1 wherein said dynamic defect is an edge dislocation, a vacancy, a dislocation loop formed by an agglomeration of vacancies within said lattice, a silicon self-interstitial atom, a substitutional atom, or a dislocation loop formed by the agglomeration of self interstitial atoms.

6. The method as recited in claim 1 wherein said substrate is a first silicon substrate and said method further includes forming a silicon-germanium layer over said first silicon substrate and forming a second silicon substrate over said silicon-germanium layer, such that said silicon-germanium layer is in a relaxed state and said second silicon substrate is in a stressed state.

7. The method as recited in claim 1 wherein said substrate is a first silicon substrate and said method further includes implanting silicon-germanium region into said first silicon region and forming a second silicon substrate located over said first silicon substrate, such that said second silicon substrate is in a stressed state.

8. The method as recited in claim 1 wherein said substrate is a first silicon substrate and said device further includes a silicon or germanium implant induced dynamic defect region within said first silicon region wherein said first silicon substrate is in a stressed state induced by said silicon or germanium implant induced dynamic defect region.

9. The method as recited in claim 1 wherein said implanting includes implanting to a peak concentration ranging from about 5E17 atoms/cm$^3$ to about 5E18 atoms/cm$^3$.

10. The method as recited in claim 1 wherein said implanting includes implanting using an energy ranging from about 40 keV to about 70 keV.

11. The method as recited in claim 1 further including annealing said implanted precipitate region using a temperature ranging from about 500° C. to about to about 1200° C. after said implanting.

12. The method as recited in claim 11 wherein said annealing includes a first anneal at a temperature ranging from about 600° C. to about 800° C. and a second anneal at a temperature ranging from about 1000° C. to about 1100° C.

13. The method of claim 1, wherein said precipitate region is noncontinuous at an area below said gate structure.

* * * * *